United States Patent
Kobayashi et al.

(10) Patent No.: US 10,573,540 B2
(45) Date of Patent: Feb. 25, 2020

(54) SUBSTRATE PROCESSING APPARATUS AND SUBSTRATE PROCESSING METHOD

(71) Applicant: SHIBAURA MECHATRONICS CORPORATION, Yokohama-shi (JP)

(72) Inventors: Nobuo Kobayashi, Yokohama (JP); Takeki Kogawa, Yokohama (JP); Katsuhiro Yamazaki, Yokohama (JP); Yuki Saito, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 15/468,577

(22) Filed: Mar. 24, 2017

(65) Prior Publication Data

US 2017/0287744 A1  Oct. 5, 2017

(30) Foreign Application Priority Data

Mar. 30, 2016 (JP) .................................. 2016-069323
Jan. 27, 2017 (JP) .................................. 2017-012627

(51) Int. Cl.
*H01L 21/67* (2006.01)
*H01L 21/306* (2006.01)

(52) U.S. Cl.
CPC .... *H01L 21/6704* (2013.01); *H01L 21/30604* (2013.01); *H01L 21/67017* (2013.01); *H01L 21/67253* (2013.01); *Y10T 137/3127* (2015.04)

(58) Field of Classification Search
CPC ........... Y10T 137/3127; H01L 21/6704; H01L 21/67253; H01L 21/67017; H01L 21/30604
See application file for complete search history.

(56) References Cited

U.S. PATENT DOCUMENTS

| 6,119,709 A * | 9/2000 | Kiyota .................. G03D 3/065 137/1 |
| 7,082,348 B1 * | 7/2006 | Dahlquist ............ G05B 13/048 162/232 |
| 9,401,291 B2 * | 7/2016 | Mimura ............ H01L 21/67253 |
| 10,043,681 B2 * | 8/2018 | Hsu .................... H01L 21/67017 |
| 2011/0071777 A1 * | 3/2011 | Duan ..................... G01D 3/02 702/55 |

FOREIGN PATENT DOCUMENTS

JP           6-151399        5/1994
KR     10-2010-0046836 A    5/2010

* cited by examiner

*Primary Examiner* — William M McCalister
*Assistant Examiner* — Patrick C Williams
(74) *Attorney, Agent, or Firm* — Oblon, McClelland, Maier & Neustadt, L.L.P.

(57) ABSTRACT

According to one embodiment, a substrate processing apparatus includes a tank that stores a treatment liquid; a liquid level pipe connected to the tank such that the treatment liquid stored in the tank flows therein, and configured such that the liquid level of the treatment liquid therein moves according to increase and decrease of the treatment liquid in the tank; a liquid level sensor that detects the liquid level in the liquid level pipe; an air supply pipe for supplying a gas to a piping space above the liquid level in the liquid level pipe; and a controller that determines whether there is erroneous detection of the liquid level sensor based on a detection result obtained by the liquid level sensor in response to the movement of the liquid level in the liquid level pipe caused by supply of the gas to the piping space from the air supply pipe.

7 Claims, 5 Drawing Sheets

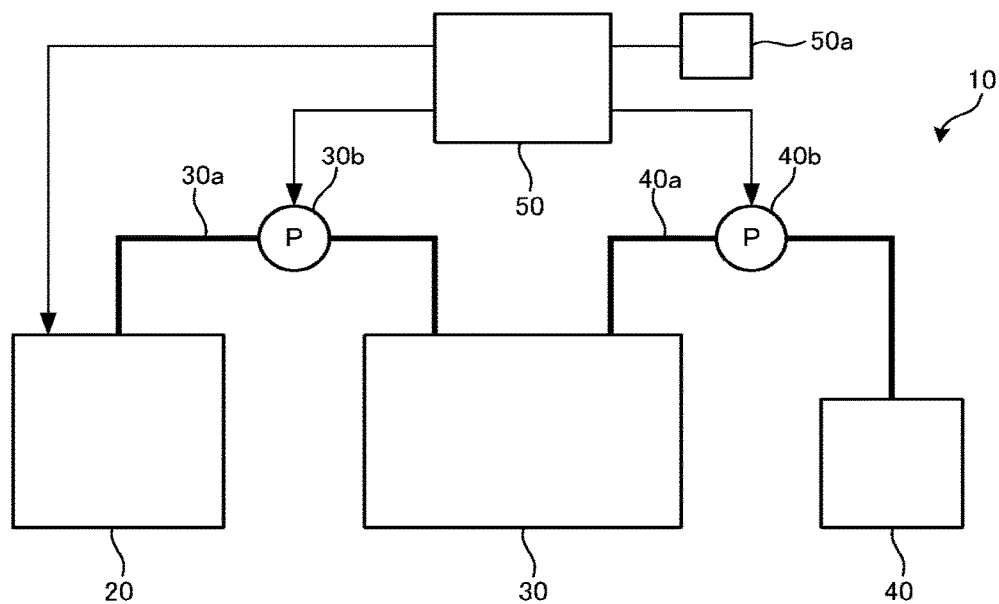
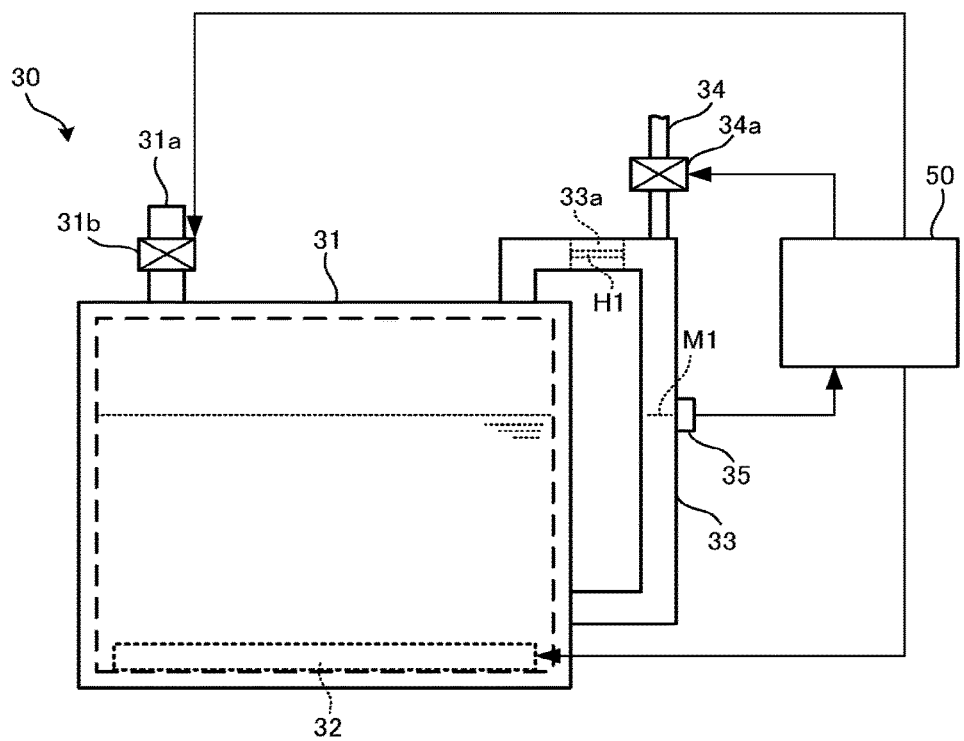

SUBSTRATE PROCESSING APPARATUS AND SUBSTRATE PROCESSING METHOD

CROSS-REFERENCE TO THE RELATED APPLICATION

This application is based upon and claims the benefit of priority from Japanese Patent Applications No. 2016-069323, filed on Mar. 30, 2016 and No. 2017-012627, filed on Jan. 27, 2017; the entire contents of all of which are incorporated herein by reference.

FIELD

Embodiments described herein relate generally to a substrate processing apparatus and a substrate processing method.

BACKGROUND

The substrate processing apparatus is used to apply a surface treatment (e.g., etching, rinsing, etc.) to various substrates such as semiconductor wafers, glass substrates for photomasks, and glass substrates for liquid crystal. The substrate processing apparatus includes a tank for storing a treatment liquid (e.g., a chemical liquid such as an etching liquid or a rinse liquid), and supplies the treatment liquid in the tank to the surface to be treated of the substrate to process the substrate.

A heater is provided in the tank of the substrate processing apparatus for heating the treatment liquid in the tank to maintain the temperature of the treatment liquid above a desired temperature. In addition, an L-shaped pipe communicating with the inside of the tank is installed outside the tank to monitor the amount of liquid in the tank, and the liquid level in the pipe is detected by a sensor. For example, two liquid level sensors are provided to detect the upper limit liquid amount and the lower limit liquid amount in the tank. Various operations, such as to replenish the tank with a liquid and stop the replenishment, are controlled according to the detection results obtained by the liquid level sensors.

The temperature of the treatment liquid in the pipe is lower than the temperature of the treatment liquid in the tank having the heater therein. Therefore, when the temperature of the treatment liquid decreases, the saturation amount of the treatment liquid (the amount of an additive that can dissolve in the treatment liquid) decreases. As a result, the additive contained in the treatment liquid in the pipe precipitates, and adheres to the inner surface of the pipe. If the precipitated additive adheres to the inner surface of the pipe, the liquid level sensor may make an erroneous detection due to the precipitates. If the liquid level sensor make an erroneous detection, it becomes impossible to accurately figure out the desired amount of the treatment liquid in the tank, for example, the upper limit liquid amount and the lower limit liquid amount. As an example, when the lower limit liquid amount, i.e., the liquid shortage is not figured out due to the erroneous detection of the liquid level sensor, the treatment liquid is not supplied to the tank. This causes the heater to heat the empty tank, and may damage the apparatus.

The erroneous detection of the liquid level sensor is caused by the precipitates adhering to the inner surface of the pipe as described above. If the precipitates adhere to the inner surface of the pipe, for example, the liquid level sensor detects the treatment liquid even in the absence of the treatment liquid at the detection position for detecting the treatment liquid in the pipe, or keeps detecting the treatment liquid even when the treatment liquid in the pipe moves up and down around the detection position.

BRIEF DESCRIPTION OF THE DRAWINGS

FIG. 1 is a schematic diagram illustrating a configuration of a substrate processing apparatus according to a first embodiment;

FIG. 2 is a schematic diagram illustrating a configuration of a liquid supply unit of the first embodiment;

DETAILED DESCRIPTION

Figure 3:
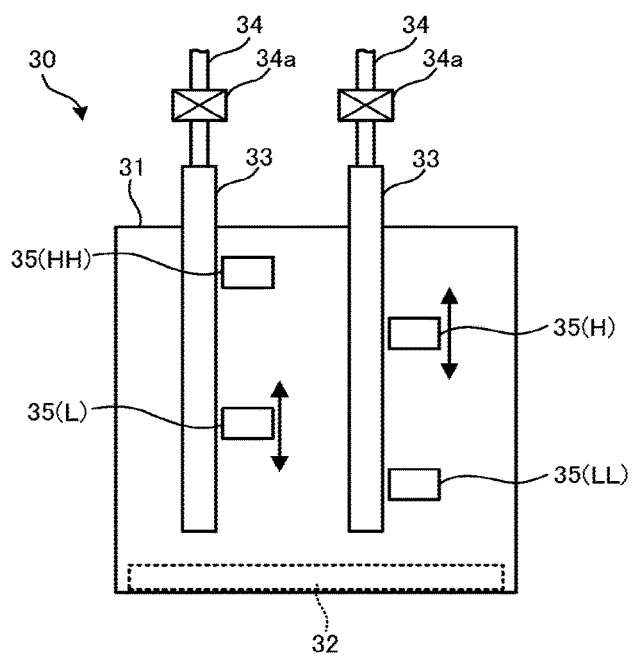
FIG. 3 is a schematic side view illustrating a configuration of the liquid supply unit of the first embodiment.

According to one embodiment, a substrate processing apparatus includes: a tank configured to store a treatment liquid for treating a substrate; a liquid level pipe connected to the tank such that the treatment liquid stored in the tank flows therein, and configured such that the liquid level of the treatment liquid having flowed therein from the tank moves according to increase and decrease of the treatment liquid in the tank; a liquid level sensor configured to detect the liquid level in the liquid level pipe; an air supply pipe configured to supply a gas to a piping space above the liquid level in the liquid level pipe; and a controller configured to determine whether there is erroneous detection of the liquid level sensor based on a detection result obtained by the liquid level sensor in response to the movement of the liquid level in the liquid level pipe caused by the supply of the gas to the piping space from the air supply pipe.

According to another embodiment, a substrate processing apparatus includes: a tank configured to store a treatment liquid for treating a substrate; a liquid level pipe connected to the tank such that the treatment liquid stored in the tank flows therein, and configured such that the liquid level of the treatment liquid having flowed therein from the tank moves according to increase and decrease of the treatment liquid in the tank; a liquid level sensor configured to detect the liquid level in the liquid level pipe; an air supply pipe configured to supply a gas to a piping space above the liquid level in the liquid level pipe; an open pipe configured to discharge the gas from the piping space; and a controller configured to performs a control operation to repeatedly supply the gas to the piping space and discharge the gas from the piping space such that the liquid level repeatedly moves in the liquid level pipe.

According to another embodiment, a substrate processing method is provided for detecting the liquid level in a liquid level pipe, which is connected to a tank such that a treatment liquid stored in the tank flows therein, with a liquid level sensor. The substrate processing method includes: supplying a gas to a piping space above the liquid level in the liquid level pipe; detecting the liquid level that moves due to the supply of the gas to the piping space from the air supply pipe with the liquid level sensor; and determining whether there is erroneous detection of the liquid level sensor based on a detection result obtained by the liquid level sensor.

According to another embodiment, a substrate processing method is provided for detecting a liquid level in a liquid level pipe, which is connected to a tank such that a treatment liquid stored in the tank flows therein, with a liquid level sensor. The substrate processing method includes: repeatedly supplying a gas to a piping space above the liquid level in the liquid level pipe and discharging the gas from the piping space such that the liquid level repeatedly moves in the liquid level pipe.

<First Embodiment>

A first embodiment is described with reference to FIGS. 1 to 4.

(Basic Configuration)

As illustrated in FIG. 1, a substrate processing apparatus 10 of the first embodiment includes a substrate processing unit 20, a liquid supply unit 30, a liquid replenishment unit 40, and a controller 50. Examples of the treatment liquid used by the substrate processing apparatus 10 include a treatment liquid containing an additive such as Si (e.g., a chemical liquid such as an etching liquid, a rinse liquid, etc.).

The substrate processing unit 20 processes a substrate by supplying the treatment liquid to its surface to be processed. For example, a processing apparatus such as a single wafer processing equipment or a batch processing equipment is used as the substrate processing unit 20. The substrate processing unit 20 is electrically connected to the controller 50, and is driven under the control of the controller 50.

The liquid supply unit 30 retains the treatment liquid and supplies the treatment liquid to the substrate processing unit 20. The liquid supply unit 30 is connected to the substrate processing unit 20 through a supply pipe 30a. The liquid supply unit 30 supplies the treatment liquid to the substrate processing unit 20 in response to the driving of a pump 30b provided in the middle of the supply pipe 30a. The pump 30b is electrically connected to the controller 50, and is driven under the control of the controller 50.

The liquid replenishment unit 40 replenishes the liquid supply unit 30 with the treatment liquid according to the amount of the treatment liquid in the liquid supply unit 30. The liquid replenishment unit 40 is connected to the liquid supply unit 30 through a replenishment pipe 40a. The liquid replenishment unit replenishes the liquid supply unit 30 with the treatment liquid in response to the driving of a pump 40b provided in the middle of the replenishment pipe 40a. The pump 40b is electrically connected to the controller 50, and is driven under the control of the controller 50.

The controller 50 includes a microcomputer for intensively controlling each unit, and a storage for storing substrate processing information and various programs related to substrate processing (both not illustrated). The controller 50 reads the substrate processing information and the programs from the storage unit to control the operation of each unit, such as the operation of the substrate processing unit 20 for substrate processing, the operation of the liquid supply unit 30 for liquid supply, and the operation of the liquid replenishment unit 40 for liquid replenishment, based on the information and the programs. A notification unit 50a such as an alarm or a display is electrically connected to the controller 50.

(Liquid Supply Unit)

As illustrated in FIGS. 2 and 3, the liquid supply unit 30 includes a tank 31, a heater 32, a plurality of liquid level pipes 33 (two in the example of FIG. 3), a plurality of air supply pipes 34 (two in the example of FIG. 3), and a plurality of liquid level sensors 35 (four in the example of FIG. 3).

The tank 31 is a reservoir for storing the treatment liquid. An open pipe 31a is connected to the tank 31. An on-off valve 31b such as an electromagnetic valve is provided in the middle of the open pipe 31a. The on-off valve 31b is electrically connected to the controller 50, and is driven to open/close position under the control of the controller 50.

The heater 32 is provided on the bottom surface inside the tank 31. The heater 32 heats the treatment liquid in the tank 31 to a temperature equal to or higher than a desired temperature, and, for example, maintains the temperature of the treatment liquid within a predetermined range according to the control of the controller 50. The heater 32 is electrically connected to the controller 50, and is driven under the control of the controller 50.

One end of each of the liquid level pipes 33 is connected to the bottom-surface-side end of a side surface (the right side surface in the example of FIG. 2) of the tank 31, and the other end is connected to the upper surface of the tank 31. That is, each of the liquid level pipes 33 is connected to the tank 31 such that the treatment liquid stored in the tank 31 flows therein. Further, each of the liquid level pipes 33 is formed such that the liquid level M1 (see FIG. 2) of the treatment liquid having flowed therein from the tank 31 moves according to an increase or decrease of the treatment liquid.

The air supply pipes 34 are each arranged with respect to each of the liquid level pipes 33. Each of the air supply pipes 34 is connected to the upper end of the corresponding one of the liquid level pipes 33 to supply a gas (e.g., inert gas such as $N_2$, etc.) to the piping space above the liquid level M1 in the liquid level pipe 33. An on-off valve 34a such as an electromagnetic valve or the like is provided in the middle of each of the air supply pipes 34. The on-off valve 34a is electrically connected to the controller 50, and is driven to open/close position under the control of the controller 50.

Incidentally, the flow rate and pressure of the gas are set such that the liquid level M1 in the liquid level pipes 33 moves by a predetermined distance (a distance at which all the liquid level sensors 35 are turned OFF) by the gas supplied to the piping space in the liquid level pipes 33. However, the flow rate and pressure of the gas can be appropriately changed according to factors such as the diameter of the air supply pipes 34 and the viscosity of the treatment liquid. In addition, the temperature of the treatment liquid in the tank 31 is not changed even when the piping space in the liquid level pipes 33 is filled (supplied) with gas.

Here, the piping space in each of the liquid level pipes 33 is connected to the tank space above the liquid level in the tank 31. An orifice member 33a (see FIG. 2) having a through hole H1 is provided inside the horizontal piping portion at the upper portion of the liquid level pipe 33. The diameter of the through hole H1 is smaller than the diameter of the liquid level pipe 33. The orifice member 33a restricts the gas supplied to the piping space in the liquid level pipe 33 from flowing into the tank 31 through the horizontal piping portion at the upper portion of the liquid level pipe 33. As a result, when the piping space in the liquid level pipe 33 is filled with gas, the liquid level M1 in the liquid level pipe 33 descends.

Each of the liquid level pipes 33 is provided with two of the liquid level sensors 35. The liquid level sensors 35 each detect the liquid level M1 in the liquid level pipe 33. For example, the liquid level sensors 35 are arranged in their respective positions to detect upper limit liquid amount (HH), replenishment start liquid amount (L), replenishment stop liquid amount (H), and lower limit liquid amount (LL).

The liquid level sensors 35 are electrically connected to the controller 50, and a detection signal thereof is input to the controller 50. Examples of the liquid level sensors 35 include electrostatic capacitance sensors and the like. In this embodiment, the treatment liquid (the liquid level M1) is detected when the electrostatic capacity sensor is ON, while the treatment liquid is not detected when it is OFF.

Although the liquid level sensor 35 for the upper limit liquid amount (HH) and the liquid level sensor 35 for the lower limit liquid amount (LL) are fixed, the liquid level sensor 35 for the replenishment start liquid amount (L) and the liquid level sensor 35 for the replenishment stop liquid amount (H) are formed to be movable in the height direction. Thereby, the user can adjust the replenishment start liquid amount and the replenishment stop liquid amount by changing the height positions of the liquid level sensors 35 for the replenishment start liquid amount and the replenishment stop liquid amount as necessary.

Although FIG. 3 illustrates two liquid level pipes (33) each provided with two liquid level sensors (35), it is not limited thereto. There may be only one liquid level pipe 33. However, if four liquid level sensors (35) are provided for one liquid level pipe (33), the intervals between the liquid level sensors 35 may be narrow in some cases. In other words, the interval between the upper limit liquid amount (HH) and the replenishment stop liquid amount (H), the interval between the replenishment start liquid amount (L) and the lower limit liquid amount (LL) becomes narrower, and the liquid level sensors 35 may interfere with one another at their detection positions. Therefore, in order to prevent the liquid level sensors 35 from interfering with one another, preferably, not one but a plurality of liquid level pipes (33) are used.

During the normal operation, the controller 50 grasps the amount of the treatment liquid in the tank 31 based on the detection result obtained by each of the liquid level sensors 35. For example, when the controller 50 determines that the liquid amount is equal to or more than the upper limit liquid amount (HH) based on the detection result obtained by each of the liquid level sensors 35, the controller 50 notifies the user of this through the notification unit 50a by issuing a warning. On the other hand, having determined that the liquid amount is equal to or less than the replenishment start liquid amount (L), the controller 50 drives the pump 40b of the liquid replenishment unit 40 to supply the treatment liquid from the liquid replenishment unit 40 to the liquid supply unit 30 through the replenishment pipe 40a. Thereafter, having determined that the liquid amount becomes the replenishment stop liquid amount (H), the controller 50 stops the pump 40b of the liquid replenishment unit 40 to stop the replenishment of the treatment liquid from the liquid replenishment unit 40 to the liquid supply unit 30. Having determined that the liquid amount is equal to or less than the lower limit liquid amount (LL), the controller 50 notifies the user of this through the notification unit 50a by issuing a warning, and stops the supply of the liquid to the substrate processing unit 20 and the heating by the heater 32. After that, having determined that the liquid amount is equal to or more than the replenishment start liquid amount (L), the controller 50 restarts the heating by the heater 32. Having determined that the liquid amount is equal to or more than the replenishment start liquid amount (L) and that the temperature of the treatment liquid becomes within a temperature range set in advance, the controller 50 restarts the supply of the liquid to the substrate processing unit 20.

In a detection test for the liquid level sensors 35, the controller 50 opens the on-off valve 34a of each of the air supply pipes 34 to supply a gas to the piping space in each of the liquid level pipes 33, and moves the liquid level M1 in the liquid level pipe 33. The controller 50 determines whether there is erroneous detection of the liquid level sensors 35 based on the detection results obtained by the liquid level sensors 35 for each of the sensors 35. That is, according to the movement of the liquid level M1 in the liquid level pipe 33, the controller 50 determines whether the liquid level sensor 35 performs the detection normally. For example, in a state where the liquid level M1 in the liquid level pipe 33 has been lowered to a position below the position of the lower limit liquid amount (LL), the controller 50 determines whether the liquid level sensor 35 is OFF (when the liquid level is not detected). When it is determined that the liquid level sensor 35 is not turned OFF, the controller 50 determines that the liquid level sensor 35 has made an erroneous detection. Further, in a state where the above-mentioned gas supply is stopped and the liquid level M1 in the liquid level pipe 33 has risen to a position above the position of the upper limit liquid amount (HH), the controller 50 determines whether the liquid level sensor 35 is ON (when the liquid level is detected). When it is determined that the liquid level sensor 35 is not turned ON, the controller 50 determines that the liquid level sensor 35 has made an erroneous detection.

(Level Sensor Detection Test)

Next, a detailed description is given of the liquid level sensor detection test performed by the substrate processing apparatus 10.

In the liquid level sensor detection test, a warning (alarm) by the notification unit 50a for the upper limit liquid amount (HH) and the lower limit liquid amount (LL), and a test mode in which the operation of the apparatus is not stopped are set. Besides, while the test mode is being set, the supply of the treatment liquid from the liquid supply unit 30 to the substrate processing unit 20 is stopped. In the tank 31 of the liquid supply unit 30, the on-off valve 31b of the open pipe 31a is opened to the atmosphere. The liquid level sensor detection test is basically conducted every predetermined period except during the substrate processing, or it is executed during a standby period. However, the liquid level sensor detection test may be performed during the substrate processing as long as it does not adversely affect the substrate processing.

Figure 4:
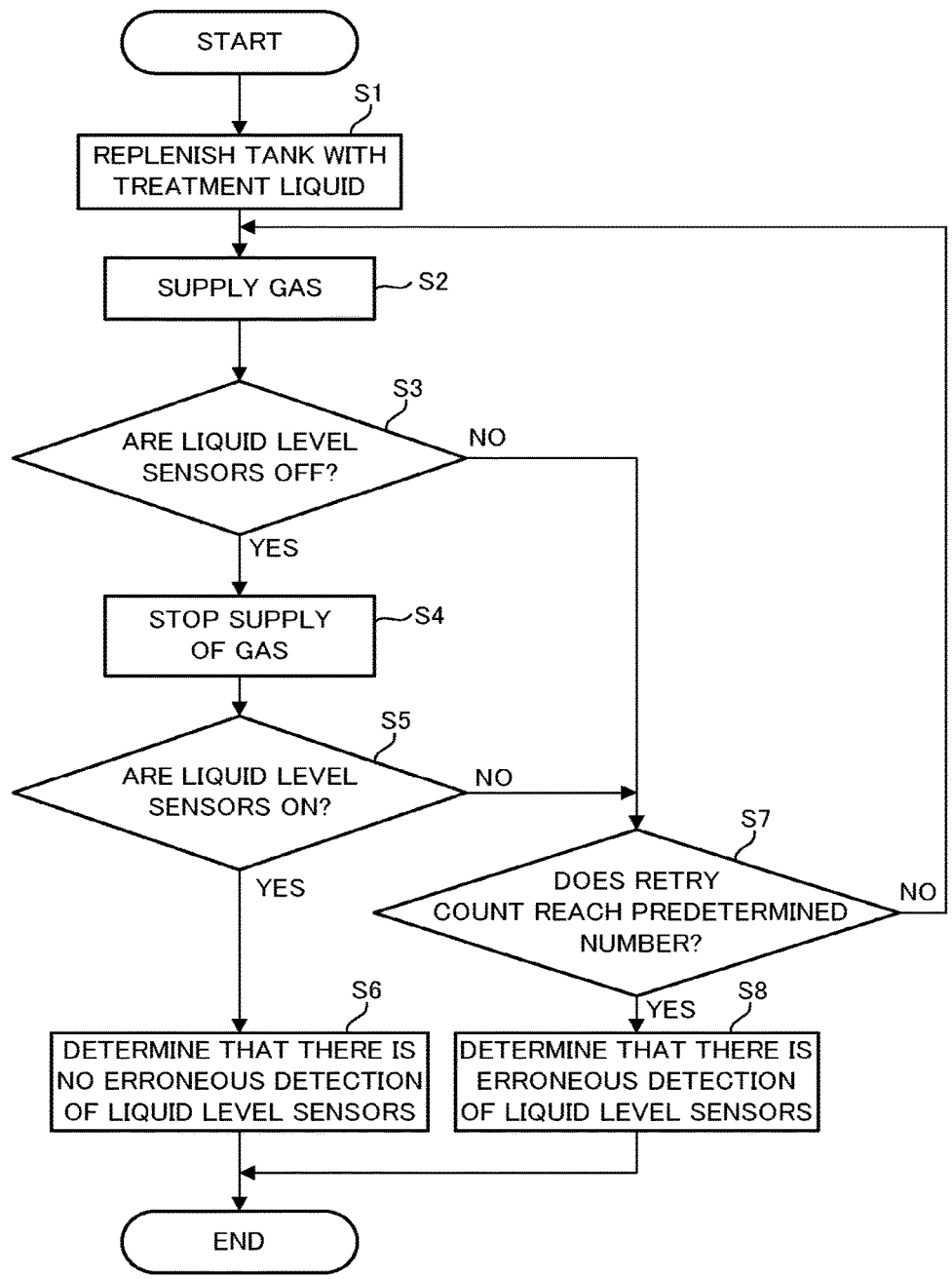
FIG. 4 is a flowchart illustrating a liquid level sensor detection test according to the first embodiment.

As illustrated in FIG. 4, in step S1, the pump 40b of the replenishment pipe 40a is driven, and the tank 31 of the liquid supply unit 30 is replenished with the treatment liquid from the liquid replenishment unit 40 through the replenishment pipe 40a. At this time, the replenishing operation is continued until the liquid level M1 in each of the liquid level pipes 33 reaches the position of the upper limit liquid amount (HH) (see FIG. 3). Then, when the liquid level M1 in the liquid level pipe 33 reaches the position of the upper limit liquid amount (HH), the replenishment of the treatment liquid is stopped. Thus, preparation is completed for the detection test of all the liquid level sensors 35.

In the replenishing operation of the treatment liquid, when the liquid level M1 is between the replenishment start liquid amount (L) and the replenishment stop liquid amount (H), the height position of the liquid level M1 varies. Therefore, the treatment liquid is not replenished by a predetermined supply amount, but is kept being supplied until the liquid level M1 reaches the upper limit liquid amount (HH). Meanwhile, before the liquid level sensor detection test, the tank 31 is prefilled with a predetermined amount of treatment liquid. However, when the tank 31 is empty as in the case before the initial liquid level sensor detection test, the treatment liquid is supplied to the tank 31 by a predetermined amount for a predetermined time at a constant flow rate such that the liquid surface M1 is at the position of the upper limit liquid amount (HH).

In step S2, the on-off valves 34a of the air supply pipes 34 are opened, and gas is supplied to the piping space in each of the liquid level pipes 33. As a result, the piping space in each of the liquid level pipes 33 are filled with a predetermined amount of gas, and the liquid level M1 in the liquid level pipe 33 moves to a position below the position of the lower limit liquid amount (LL). The gas flow rate and pressure at this time are set in advance such that the liquid surface M1 in the liquid level pipe 33 moves to a position below the position of the lower limit liquid amount (LL) by the gas supplied to the piping space in the liquid level pipe 33.

In step S3, it is determined whether all the liquid level sensors 35 are OFF in a state where the liquid surface M1 in each of the liquid level pipes 33 is below the position of the lower limit liquid amount (LL). When it is determined that all the liquid level sensors 35 are OFF (YES), in step S4, the on-off valves 34a of the air supply pipes 34 are closed, and the supply of gas to the piping space in each of the liquid level pipes 33 is stopped. Accordingly, the gas in the piping space in each of the liquid level pipes 33 is gradually discharged into the tank through the horizontal piping portion at the upper portion of each of the liquid level pipes 33, i.e., the through hole H1 of the orifice member 33a. As a result, the liquid level M1 in each of the liquid level pipes 33 moves slowly to the original position of the upper limit liquid amount (HH) (the rising speed is lower than the falling speed).

In step S5, after a predetermined time has elapsed from the stop of gas supply, i.e., in a state where the liquid surface M1 in each of the liquid level pipes 33 is at or above the position of the upper limit liquid amount (HH), it is determined whether each of the liquid level sensors 35 is ON. If it is determined that all the liquid level sensors 35 are ON (YES), in step S6, it is determined that there is no erroneous detection of the liquid level sensors 35.

On the other hand, when it is determined that each of the liquid level sensors 35 is not OFF in step S3 (NO), or when it is determined that each of the liquid level sensors 35 is not ON in step S5 (NO), it is determined in step S7 whether the number of determinations on erroneous detection of the liquid level sensor 35 (retry count) is a predetermined number (e.g., three times).

If it is determined that the number of determinations on liquid return is not the predetermined number (e.g., three times) in step S7 (NO), the process returns to step S2, and the steps from step S2 are repeated.

On the other hand, when it is determined that the number of determinations on liquid return is the predetermined number (e.g., three times) in step S7 (YES), it is determined in step S8 that there is erroneous detection of the liquid level sensors 35. In this case, for example, the notification unit 50a informs the user of that there is erroneous detection of the liquid level sensors 35. Incidentally, the controller 50 can specify the liquid level sensor 35 that has made the erroneous detection, and notifies the user of the liquid level sensor 35, in which the erroneous detection has occurred, by the notification unit 50a.

In the liquid level sensor detection test, gas is supplied to the piping space in each of the liquid level pipes 33, and the liquid level M1 in the liquid level pipe 33 moves. Accordingly, it is determined whether there is erroneous detection with respect to each of the liquid level sensors 35 based on the detection result obtained by the liquid level sensor 35. For example, in a state where the liquid level M1 in the liquid level pipe 33 has been lowered to a position below the position of the lower limit liquid amount (LL), it is determined whether the liquid level sensor 35 is OFF. When it is determined that the liquid level sensor 35 is not turned OFF, it is determined that the liquid level sensor 35 has made an erroneous detection. Further, in a state where the gas supply is stopped and the liquid level M1 in the liquid level pipe 33 has risen to a position above the position of the upper limit liquid amount (HH), it is determined whether the liquid level sensor 35 is ON. When it is determined that the liquid level sensor 35 is not turned ON, it is determined that the liquid level sensor 35 has made an erroneous detection. In this way, it is possible to know erroneous detection of the liquid level sensors 35. This prevents the liquid amount in the tank 31 from being determined based on a detection result obtained by the liquid level sensor 35 having made an erroneous detection. Thus, it is possible to accurately figure out the desired amount of liquid in the tank 31 that stores the treatment liquid.

Here, when it is determined that there is erroneous detection of the liquid level sensors 35, precipitates of the additive adhere to the inner surface of the liquid level pipes 33. In order to remove the precipitates, for example, it is effective to repeatedly supply a gas to and discharge the gas from the piping space in each of the liquid level pipes 33 to repeatedly move the liquid level M1 in each of the liquid level pipes 33 up and down. In this case, the precipitates adhering to the inner peripheral surface of the liquid level pipe 33 can be peeled off and removed by the repetitive vertical movement of the liquid level M1 in each of the liquid level pipes 33. Thereby, erroneous detection of the liquid level sensor 35 can be suppressed. Thus, it is possible to accurately figure out the desired liquid amount in the tank 31 that stores the treatment liquid.

As described above, according to the first embodiment, gas is supplied from the air supply pipes 34 to the piping space in the liquid level pipes 33, and in response to the movement of the liquid level M1 in the liquid level pipes 33, it is possible to know whether there is erroneous detection of the liquid level sensors 35 by determining whether there is erroneous detection of the liquid level sensors 35 based on detection results obtained by the liquid level sensors 35. This prevents the amount of liquid in the tank 31 from being determined based on a detection result obtained by the liquid level sensor 35 with erroneous detection. Thus, the amount of liquid in the tank is determined based on a detection result obtained by the liquid level sensor 35 without erroneous detection. Therefore, it is possible to accurately figure out the desired liquid amount in the tank 31 that stores the treatment liquid.

<Second Embodiment>

A second embodiment is described with reference to FIG. 5. The second embodiment is basically similar to the first embodiment except the structure of the liquid level pipes. In the following, the difference is described, and the same explanation is not repeated.

Figure 5:
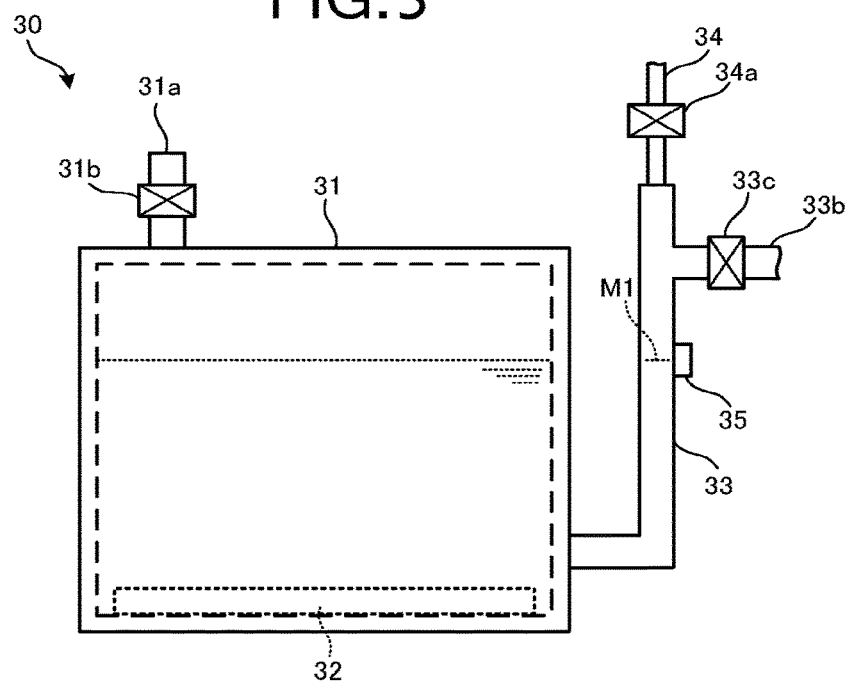
FIG. 5 is a schematic diagram illustrating a configuration of a liquid supply unit according to a second embodiment.

As illustrated in FIG. 5, according to the second embodiment, one end of the liquid level pipe 33 is connected to the bottom-surface-side end of a side surface (the right side surface in the example of FIG. 5) of the tank 31 as in the first embodiment. However, differently from the first embodiment, the other end is not connected to the upper surface of the tank 31 (the space inside the tank 31), but is connected to the air supply pipe 34.

Besides, an open pipe 33b is connected to the upper end of the liquid level pipe 33. One end of the open pipe 33b is connected to a position above the upper limit liquid amount (HH) in the liquid level pipe 33, and the other end of the open pipe 33b is open to the atmosphere. An on-off valve 33c such as, for example, an electromagnetic valve is provided in the middle of the open pipe 33b. The on-off valve 33c is electrically connected to the controller 50, and is driven to open/close position under the control of the controller 50. Incidentally, the on-off valve 33c is closed when gas is supplied from the air supply pipe 34, and is open after the gas supply is stopped.

Also in the liquid level pipe 33, as in the first embodiment, when the piping space in the liquid level pipe 33 is filled with gas, the liquid level M1 in the liquid level pipe 33 moves. At this time, differently from the first embodiment, the gas supplied into the liquid level pipe 33 is not exhausted to the tank 31 side but acts on the liquid level M1 in the liquid level pipe 33. Therefore, if the flow rate and pressure of the gas are the same as in the first embodiment, the movement speed of the liquid level M1 in the liquid level pipe 33 is faster than in the first embodiment. This results in a shorter waiting time for the movement of the liquid level M1 in the liquid level pipe 33 in the liquid level sensor detection test. Thus, the liquid level sensor detection test requires less time.

As described above, the second embodiment can achieve the same effects as those of the first embodiment. Further, since one end of the liquid level pipe 33 is not connected to the space inside the tank 31 and the open pipe 33b is connected to the liquid level pipe 33, the gas supplied to the piping space in the liquid level pipe 33 is not exhausted to the tank 31 but acts on the liquid level M1 in the liquid level pipe 33. Thus, the liquid level sensor detection test requires less time.

<Third Embodiment>

A third embodiment is described with reference to FIG. 6. The third embodiment is basically similar to the first embodiment except the presence of a heating unit. In the following, the difference is described, and the same explanation is not repeated.

Figure 6:
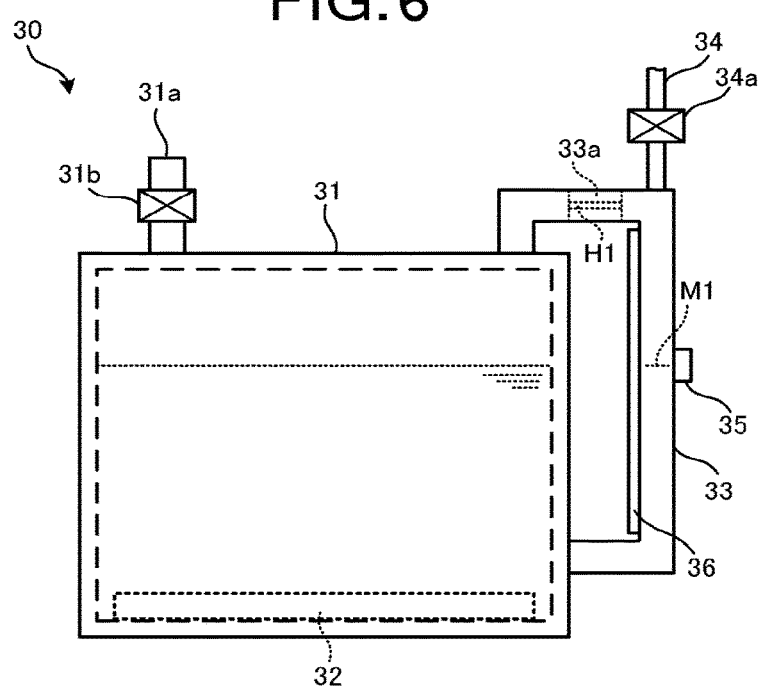
FIG. 6 is a schematic diagram illustrating a configuration of a liquid supply unit according to a third embodiment.

As illustrated in FIG. 6, the liquid supply unit 30 of the third embodiment includes a heating unit 36 such as a heater. The heating unit 36 is located on the outer periphery of the liquid level pipe 33, and heats the treatment liquid in the liquid level pipe 33 to maintain its temperature within a predetermined range. This makes it possible to suppress the temperature decrease of the treatment liquid in the liquid level pipe 33. Thus, precipitation of the additive can be suppressed. The heating unit 36 is electrically connected to the controller 50, and is driven under the control of the controller 50.

However, even if the temperature is controlled as described above, the additive contained in the treatment liquid in the liquid level pipe 33 may precipitate and adhere to the inner surface of the liquid level pipe 33. Therefore, for example, having determined that there is erroneous detection of the liquid level sensor 35, the controller 50 increases the heating temperature of the heating unit 36 for heating the treatment liquid as compared to a case where it is determined that there is no erroneous detection of the liquid level sensor 35. Thereby, the treatment liquid in the liquid level pipe 33 is heated with a higher temperature, which dissolves precipitates adhering to the inner surface of the liquid level pipe 33 in the treatment liquid and removes it.

As described above, the third embodiment can achieve the same effects as those of the first embodiment. Further, by heating the treatment liquid in the liquid level pipe 33 with the heating unit 36 provided in the liquid level pipe 33, the temperature of the treatment liquid can be maintained within a predetermined range. This prevents the additive contained in the treatment liquid from depositing and adhering to the inner surface of the liquid level pipe 33. Besides, when it is determined that there is erroneous detection of the liquid level sensor 35, the heating temperature of the heating unit 36 for the treatment liquid is increased as compared to a case where it is determined that there is no erroneous detection of the liquid level sensor 35. Thereby, the treatment liquid in the liquid level pipe 33 is heated with a higher temperature, which dissolves precipitates adhering to the inner surface of the liquid level pipe 33 in the treatment liquid and removes it.

In the third embodiment described above, the heating unit 36 is provided by way of example but not limitation. For example, a vibrating unit (see reference numeral 36 in FIG. 6) may be provided in place of the heating unit 36 to vibrate the treatment liquid in the liquid level pipe 33, or both of them can be provided. By vibrating the treatment liquid in the liquid level pipe 33 with the vibrating unit, it is possible to remove precipitates adhering to the inner surface of the liquid level pipe 33. For example, the controller 50 vibrates the treatment liquid with the vibrating unit only when having determined that there is erroneous detection of the liquid level sensor 35. Alternatively, the controller 50 may constantly vibrate the treatment liquid with the vibrating unit to suppress precipitates from adhering to the inner surface of the liquid level pipe 33. When having determined that there is erroneous detection of the liquid level sensor 35, the controller 50 may increase the frequency of the vibrating unit for vibrating the treatment liquid as compared to a case where it is determined that there is no erroneous detection of the liquid level sensor 35. In this case, by vibrating the treatment liquid in the liquid level pipe 33 at a higher frequency, it is possible to reliably remove precipitates adhering to the inner surface of the liquid level pipe 33.

<Fourth Embodiment>

A fourth embodiment is described with reference to FIG. 7. The fourth embodiment is basically similar to the first embodiment except the presence of a circulating unit. In the following, the difference is described, and the same explanation is not repeated.

Figure 7:
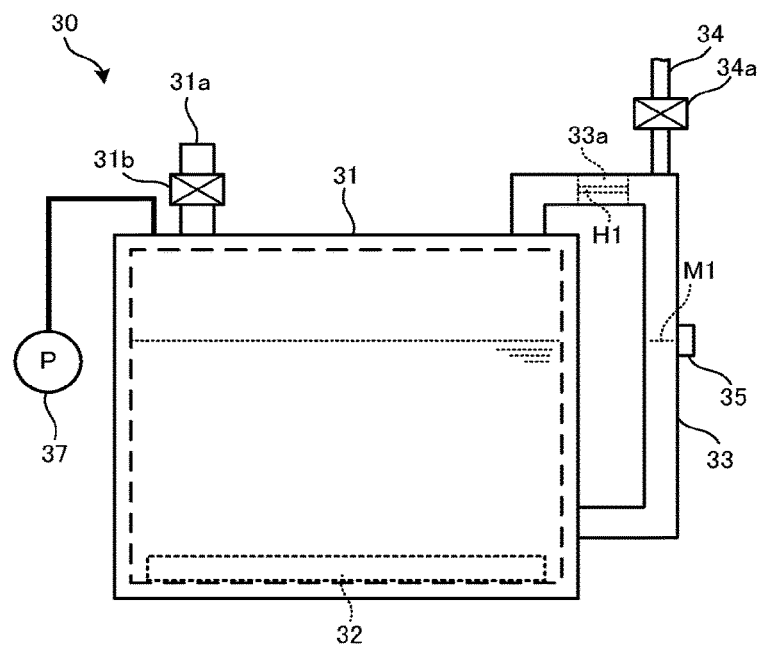
FIG. 7 is a schematic diagram illustrating a configuration of a liquid supply unit according to a fourth embodiment.

As illustrated in FIG. 7, the liquid supply unit 30 of the fourth embodiment is provided with a circulating unit 37 that enables pumping. The circulating unit 37 is, for example, a pump or the like, and is connected to the interior of the tank 31. The circulating unit 37 is electrically connected to the controller 50, and is driven under the control of the controller 50. The circulating unit 37 pushes the treatment liquid in the sealed tank 31 to return the treatment liquid in the liquid level pipe 33 to the tank 31 for circulation. The treatment liquid in the tank 31 flows into the liquid level pipe 33 from an opening on the lower side of the liquid level pipe 33. The treatment liquid flows in a direction rising in the liquid level pipe 33, and flows back into the tank 31 from an opening on the upper side of the liquid level pipe 33. As a result, a flow of the treatment liquid is generated in the liquid level pipe 33.

Such a circulation operation is periodically performed. With this, the treatment liquid circulates regularly through the liquid level pipe 33, and the treatment liquid in the liquid level pipe 33 moves. The flow of the treatment liquid prevents precipitates from adhering to the inner surface of the liquid level pipe 33. Further, since the treatment liquid heated in the tank 31 flows into the liquid level pipe 33, it is also possible to heat the interior of the liquid level pipe 33. Thus, the precipitates in the liquid level pipe 33 can be dissolved in the treatment liquid and removed. In addition, it is also possible to prevent the additive contained in the treatment liquid in the liquid level pipe 33 from depositing and adhering to the inner surface of the liquid level pipe 33.

However, even if the aforementioned circulation control is periodically performed, the additive contained in the treatment liquid in the liquid level pipe 33 may precipitate and adhere to the inner surface of the liquid level pipe 33 in some cases. Therefore, for example, when having determined that there is erroneous detection of the liquid level sensor 35, the controller 50 increases the pushing force of the circulating unit 37 on the treatment liquid to increase the flow rate of the treatment liquid to be circulated as compared to when having determined that there is no erroneous detection of the liquid level sensor 35. Thereby, the treatment liquid in the liquid level pipe 33 circulates at a higher flow rate. Thus, it is possible to remove precipitates adhering to the inner surface of the liquid level pipe 33.

As described above, the fourth embodiment can achieve the same effects as those of the first embodiment. Further, with the circulating unit 37 provided in the tank 31, the treatment liquid in the liquid level pipe 33 can be flowed back into the tank 31 for circulation. This prevents the additive contained in the treatment liquid in the liquid level pipe 33 from depositing and adhering to the inner surface of the liquid level pipe 33. Further, when it is determined that there is erroneous detection of the liquid level sensor 35, the flow rate of the treatment liquid is increased by the circulating unit 37 as compared to a case where it is determined that there is no erroneous detection of the liquid level sensor 35. Thereby, the treatment is circulated at a higher flow rate. Thus, it is possible to remove precipitates adhering to the inner surface of the liquid level pipe 33.

<Other Embodiments>

In each of the embodiments described above, a plurality of the liquid level sensors 35 (four in the example of FIG. 3) are provided by way of example but not limitation. For example, there may be provided only a couple of liquid level sensors (35) for the upper limit liquid amount (HH) the lower limit liquid amount (LL). Alternatively, there may be provided only one liquid level sensor (35) for the lower limit liquid amount (LL). The number of sensors is not particularly limited. In addition, all the liquid level sensors 35 are not necessarily subjected to the detection test. The detection test may be conducted for only the liquid level sensor 35, which is likely to make erroneous detection. In this case, the liquid replenishment in step S1 in FIG. 4 is not always required. If the liquid level sensor 35 to be subjected to the detection test is in the ON state, the liquid replenishment in step S1 can be omitted.

In each of the embodiments described above, it is determined whether there is erroneous detection of the liquid level sensor 35 based on ON/OFF of the liquid level sensor 35 according to the supply of gas to the piping space of the liquid level pipe 33. However, this is by way of example and not limitation. For example, it is also possible to determine whether there is erroneous detection of the liquid level sensor 35 according to the liquid return time, i.e., the time which it takes for the liquid level M1 that has once descended by the filling of gas in the piping space of the liquid level pipe 33 to return to the original position. The liquid return time varies depending on the amount of precipitates adhering to the inner surface of the liquid level pipe 33, and becomes longer as, for example, the amount of the precipitates increases. Therefore, if the liquid return time is within a predetermined time, the amount of the precipitates is equal to or less than the predetermined amount (the amount of precipitates in which erroneous detection of the liquid level sensor 35 does not occur), and it is determined that there is no erroneous detection of the liquid level sensor 35. On the other hand, when the liquid return time is not within the predetermined time, it is determined that the amount of the precipitates is larger than the predetermined amount, and there is erroneous detection of the liquid level sensor 35. The correlation between the liquid return time and the amount of precipitates has been obtained in advance by experiments or the like, and the predetermined time is set based on the correlation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus, comprising:
a tank configured to store a treatment liquid for treating a substrate;
a liquid level pipe having a lower end connected to the tank such that the treatment liquid stored in the tank flows therein, and configured such that a liquid level of the treatment liquid having flowed therein from the tank moves according to increase and decrease of the treatment liquid in the tank;
a liquid level sensor configured to detect the liquid level in the liquid level pipe;
a gas supply pipe connected directly to the liquid level pipe at a position above the liquid level of the treatment liquid, and configured to supply a gas to a piping space above the liquid level in the liquid level pipe;
a controller configured to control a supply of the gas to the piping space from the gas supply pipe such that the liquid level moves down in the liquid level pipe and to control a discharge of the gas from the piping space such that the moved down liquid level moves up or down in the liquid level pipe.

2. The substrate processing apparatus of claim 1, wherein the controller is further configured to control the supply of the gas to the piping space from the gas supply pipe such that the liquid level moves down in the liquid level pipe in a state where the treatment liquid is not flowing from the tank and control the discharge of the gas from the piping space such that the moved down liquid level moves up in the liquid level pipe in the state where the treatment liquid is not flowing from the tank.

3. The substrate processing apparatus of claim 1, wherein the controller is further configured to control the supply of the gas to the piping space such that the liquid level moves down to a position where the liquid level sensor does not detect the liquid level.

4. The substrate processing apparatus of claim 1, wherein the controller is further configured to repeatedly control the supply of the gas to the piping space and repeatedly control the discharge of the gas from the piping space such that the liquid level repeatedly moves up and down in the liquid level pipe.

5. The substrate processing apparatus of claim 1, further comprising; an open pipe connected to the liquid level pipe at a position above the liquid level of the treatment liquid, and configured to discharge the gas from the piping space; and an on-off valve arranged in middle of the open pipe, and configured to restrict the discharge of the gas from the piping space.

6. The substrate processing apparatus of claim 1, wherein the controller is further configured to determine whether there is erroneous detection of the liquid level sensor based on a detection result obtained by the liquid level sensor in response to a movement of the liquid level in the liquid level pipe caused by the supply of the gas to the piping space from the gas supply pipe.

7. The substrate processing apparatus of claim 6, wherein, having determined that there is erroneous detection of the liquid level sensor, the controller performs a control operation to repeatedly control the supply of the gas to the piping space and repeatedly control the discharge of the gas from the piping space such that the liquid level repeatedly moves up and down in the liquid level pipe.

* * * * *